United States Patent
Wheatley et al.

(10) Patent No.: US 12,066,329 B2
(45) Date of Patent: Aug. 20, 2024

(54) SENSOR ARRAY SPECTROMETER

(71) Applicant: 3M INNOVATIVE PROPERTIES COMPANY, St. Paul, MN (US)

(72) Inventors: John A. Wheatley, Stillwater, MN (US); Mark A. Roehrig, Stillwater, MN (US); Audrey A. Sherman, Woodbury, MN (US); Del R. Lawson, Cottage Grove, MN (US); Gilles J. Benoit, Minneapolis, MN (US); Daniel J. Schmidt, Woodbury, MN (US); Jonah Shaver, St. Paul, MN (US); Raymond J. Kenney, Woodbury, MN (US); Zhaohui Yang, North Oaks, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 182 days.

(21) Appl. No.: 17/440,004

(22) PCT Filed: Mar. 19, 2020

(86) PCT No.: PCT/IB2020/052538
§ 371 (c)(1),
(2) Date: Sep. 16, 2021

(87) PCT Pub. No.: WO2020/194146
PCT Pub. Date: Oct. 1, 2020

(65) Prior Publication Data
US 2022/0178749 A1    Jun. 9, 2022

Related U.S. Application Data

(60) Provisional application No. 62/823,858, filed on Mar. 26, 2019.

(51) Int. Cl.
*G01J 3/28* (2006.01)
*G02B 5/22* (2006.01)

(52) U.S. Cl.
CPC .............. *G01J 3/2803* (2013.01); *G02B 5/22* (2013.01)

(58) Field of Classification Search
CPC .. G01J 3/2803; G01J 2003/2806; G02B 5/22; G02B 5/201; H01L 25/167
See application file for complete search history.

(56) References Cited

U.S. PATENT DOCUMENTS

| 3,610,729 A | 10/1971 | Rogers |
| 4,446,305 A | 5/1984 | Rogers |

(Continued)

FOREIGN PATENT DOCUMENTS

| CN | 108458785 | 8/2018 | |
| CN | 108458785 A | * 8/2018 | ................ G01J 3/28 |

(Continued)

OTHER PUBLICATIONS

Nixon, "Multispectral fingerprint imaging for spoof detection", Proceedings of SPIE, Biometric Technology for Human Identification II; Mar. 2005, vol. 5779, No. 1, pp. 214-225.

(Continued)

*Primary Examiner* — Edmond C Lau
*Assistant Examiner* — Mohamed Doumbia
(74) *Attorney, Agent, or Firm* — Clifton F. Richardson

(57) ABSTRACT

An optical device is disclosed and includes an optical sensor, a plurality of photosensitive pixels disposed on the optical sensor, a wavelength-selective optical filter in optical communication with the photosensitive pixels, and a plurality of spatially-variant written regions disposed in the optical filter, the written regions having a transmission spectrum and each of the written regions being larger than each of the pixels.

15 Claims, 13 Drawing Sheets

(56) References Cited

U.S. PATENT DOCUMENTS

| | | | |
|---|---|---|---|
| 4,540,623 A | 9/1985 | Im | |
| 5,103,337 A | 4/1992 | Schrenk | |
| 5,360,659 A | 11/1994 | Arends | |
| 5,448,404 A | 9/1995 | Schrenk | |
| 5,882,774 A | 3/1999 | Jonza | |
| 6,157,490 A | 12/2000 | Wheatley | |
| 9,810,930 B2 | 11/2017 | Merrill | |
| 2010/0321542 A1* | 12/2010 | Koskinen | H04N 25/611 |
| | | | 250/216 |
| 2012/0236313 A1 | 9/2012 | Nakamura | |
| 2016/0334649 A1* | 11/2016 | Merrill | B05D 5/063 |

FOREIGN PATENT DOCUMENTS

| | | | | |
|---|---|---|---|---|
| JP | 2013545274 A * | 4/2012 | | |
| WO | WO-2010075373 A1 * | 7/2010 | | B42D 25/23 |
| WO | WO-2017127734 A1 * | 7/2017 | | G02B 5/204 |
| WO | WO 2018-075640 | 4/2018 | | |
| WO | WO 2018-204639 | 11/2018 | | |
| WO | WO-2019082130 A1 * | 5/2019 | | G06K 9/209 |
| WO | WO 2019-118685 | 6/2019 | | |

OTHER PUBLICATIONS

Vuuren, "Organic Photodiodes: The Future of Full Color Detection and Image Sensing", Advanced Materials, Jun. 2016, vol. 28, No. 24, pp. 4766-4802.

International Search Report for PCT International Application No. PCT/IB2020/052538, mailed on Jun. 16, 2020, 4 pages.

* cited by examiner

SENSOR ARRAY SPECTROMETER

BACKGROUND

Optical filters are employed in a wide variety of applications including optical communication systems, optical sensors, imaging, scientific optical equipment and display systems. Such optical filters may include optical layers that manage the transmission of incident electromagnetic radiation, including light.

Optical filters may reflect or absorb certain portions of incident light and transmit other portions of incident light. Layers within an optical filter may also differ in wavelength selectivity, optical transmittance, optical clarity, optical haze and index of refraction. Systems involving optical sensors and optical filters can gather specific electromagnetic data by nature of the optical filter.

SUMMARY

In some aspects, the present disclosure provides an optical device. The optical device can include an optical sensor and a plurality of photosensitive pixels can be disposed on the optical sensor. A wavelength-selective optical filter can be in optical communication with the photosensitive pixels, and a plurality of spatially-variant written regions can be disposed in the optical filter. The written regions each can have a transmission spectrum and each of the written regions can be larger than each of the pixels.

In some aspects, the present disclosure provides an optical device. The optical device can include an optical sensor and a plurality of photosensitive pixels can be disposed on the optical sensor. A wavelength-selective optical filter can be in optical communication with the photosensitive pixels, and a plurality of spatially-variant written regions can be disposed in the optical filter. The written regions each can have a transmission spectrum and each of the written regions can be larger than each of the pixels. Further, an angle-selective filter can be in optical communication with the optical sensor and optical filter.

In some aspects, the present disclosure provides an optical device. The optical device can include an optical sensor, a plurality of photosensitive pixels disposed on the optical sensor and a wavelength-selective optical filter in optical communication with the photosensitive pixels. A first plurality of spatially-variant areas can be disposed in the optical filter and a second plurality of spatially-variant areas can be disposed in the optical filter, the areas of the first plurality of spatially-variant areas can have a transmission spectrum different from that of the areas of the second plurality of spatially-variant areas.

DETAILED DESCRIPTION

Figure 1:
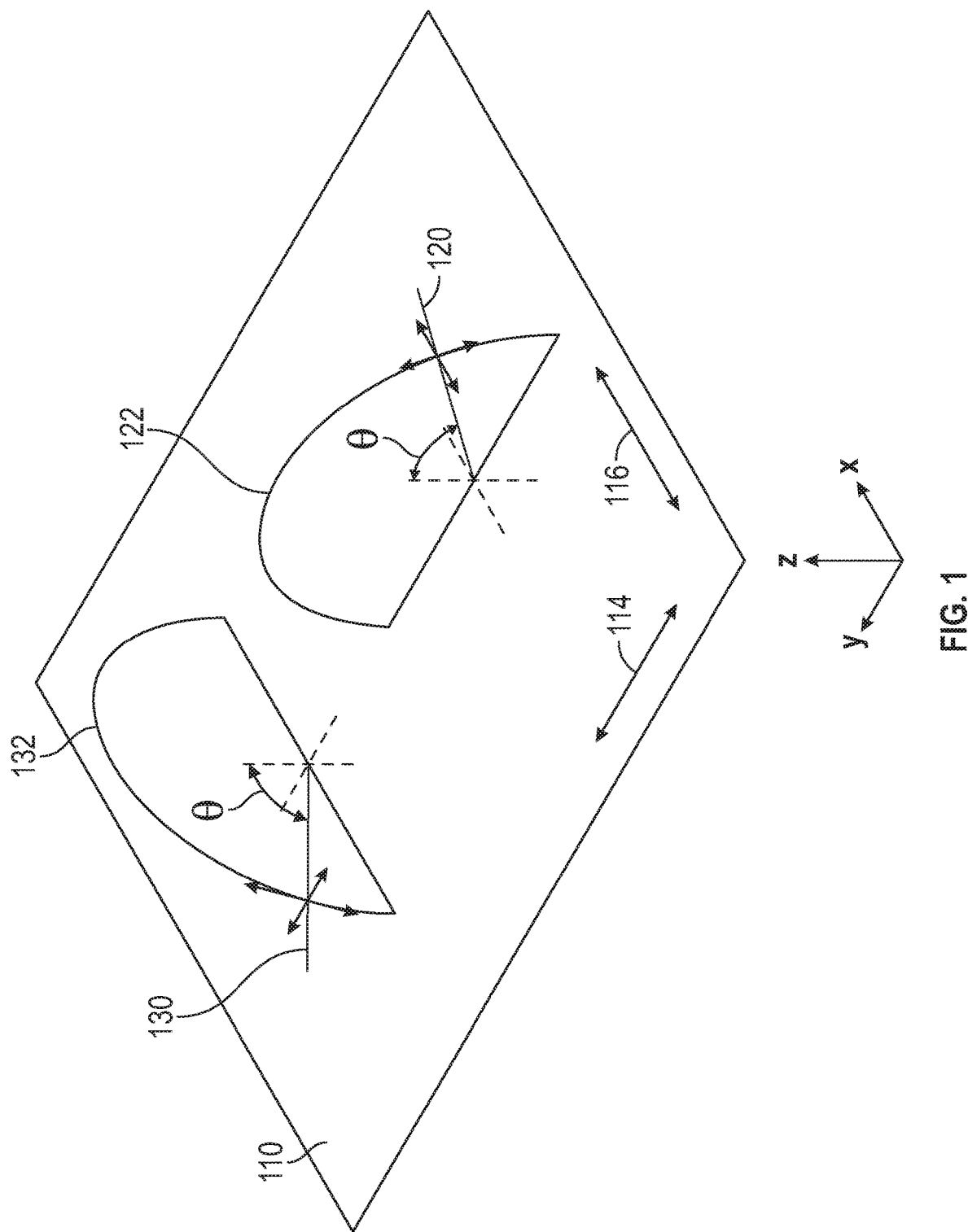
FIG. 1 is a schematic perspective view of a reflective film according to exemplary implementations of the present disclosure.

In the following description, reference is made to the accompanying drawings that form a part hereof and in which various embodiments are shown by way of illustration. The drawings are not necessarily to scale. It is to be understood that other embodiments and implementations are contemplated and may be made without departing from the scope or spirit of the present description. The following detailed description, therefore, is not to be taken in a limiting sense.

Multilayer optical films, i.e., films that provide desirable transmission and/or reflection properties at least partially by an arrangement of microlayers of differing refractive index, are known. It has been known to make such multilayer optical films by depositing a sequence of inorganic materials in optically thin layers ("microlayers") on a substrate in a vacuum chamber. Inorganic multilayer optical films are described, for example, in textbooks by H. A. Macleod, *Thin-Film Optical Filters,* 2nd Ed., Macmillan Publishing Co. (1986) and by A. Thelan, *Design of Optical Interference Filters,* McGraw-Hill, Inc. (1989).

Multilayer optical films have also been demonstrated by coextrusion of alternating polymer layers. See, e.g., U.S. Pat. No. 3,610,729 (Rogers), U.S. Pat. No. 4,446,305 (Rogers et al.), U.S. Pat. No. 4,540,623 (Im et al.), U.S. Pat. No.

5,448,404 (Schrenk et al.) and U.S. Pat. No. 5,882,774 (Jonza et al.). In these polymeric multilayer optical films, polymer materials are used predominantly or exclusively in the makeup of the individual layers. These may be referred to as thermoplastic multilayer optical films. Such films are compatible with high volume manufacturing processes and can be made in large sheets and roll goods. The description and examples below relate, in some implementations of the present disclosure, to thermoplastic multilayer optical films.

A multilayer optical film includes individual microlayers having different refractive index characteristics such that some light is reflected at interfaces between adjacent microlayers. The microlayers are sufficiently thin so that light reflected at a plurality of the interfaces undergoes constructive or destructive interference in order to give the multilayer optical film the desired reflective or transmissive properties. For multilayer optical films designed to reflect light at ultraviolet, visible, or near-infrared wavelengths, each microlayer may have an optical thickness (a physical thickness multiplied by refractive index) of less than about 1 µm. Layers may be arranged generally as thinnest to thickest. In some embodiments, the arrangement of the alternating optical layers may vary substantially linearly as a function of layer count. These layer profiles may be referred to as linear layer profiles. Thicker layers may be included, such as skin layers at the outer surfaces of the multilayer optical film, or protective boundary layers (PBLs) disposed within the multilayer optical films, that separate coherent groupings (referred to herein as "packets") of microlayers. In some cases, the protective boundary layer may be the same material as at least one of the alternating layers of the multilayer optical film. In other cases, the protective boundary layer may be a different material, selected for its physical or rheological properties. The protective boundary layers may be on one side or on both sides of an optical packet. In the case of a single-packet multilayer optical film, the protective boundary layer may be on one or both external surfaces of the multilayer optical film.

Packets, for the purpose of this description, can be monotonically varying thicknesses of optical repeat units. For example, packets may be monotonically increasing, monotonically decreasing, both increasing and constant, or both decreasing and constant. One or several layers that do not follow this pattern should be understood to be nonconsequential to the overall definition or identification of a certain optical repeat layer grouping as a packet. In some embodiments, it may be helpful to define a packet as the largest discrete grouping of consecutive, non-redundant layer pairs that collectively provides reflection over a certain subrange of the spectrum of interest (e.g., the visible spectrum).

In some cases, the microlayers have thicknesses and refractive index values providing a ¼-wave stack, i.e., arranged in optical repeat units or unit cells each having two adjacent microlayers of equal optical thickness (f-ratio=0.5), such optical repeat unit being effective to reflect by constructive interference light whose wavelength λ is about twice the overall optical thickness of the optical repeat unit. Other layer arrangements, such as multilayer optical films having 2-microlayer optical repeat units whose f-ratio is different from 50%, or films whose optical repeat units include more than two microlayers, are also known. These optical repeat unit designs can be configured to reduce or to increase certain higher-order reflections. See, e.g., U.S. Pat. No. 5,360,659 (Arends et al.) and U.S. Pat. No. 5,103,337 (Schrenk et al.). Thickness gradients of the optical repeat units along a thickness axis of the film (e.g., the z-axis) can be used to provide a widened reflection band, such as a reflection band that extends over the entire human visible region and into the near infrared so that as the band shifts to shorter wavelengths at oblique incidence angles the microlayer stack continues to reflect over the entire visible spectrum. Thickness gradients tailored to sharpen band edges, i.e., the wavelength transition between high reflection and high transmission, are discussed in U.S. Pat. No. 6,157,490 (Wheatley et al.). Further, the multilayer optical film can use an optical absorber incorporated therein, which can be a pigment or a dye, to modify a transmission spectrum of the multilayer optical film. The optical absorber can be a coating or can be included anywhere along an optical path through the multilayer optical film.

As will be discussed below, the present disclosure provides an optical device for analyzing an optical spectrum of one or more areas. Through various elements and technologies, the optical device can be optimized to gather optical data of a measurand having a particular absorption spectrum. Non-limiting applications could include multispectral "liveness" detection for fingerprints or other biometrics, health care diagnostics including remote medicine modes, authentication of a part using spectra as an identifying feature and many other possible uses.

FIG. 1 is a schematic perspective view of a reflective film. FIG. 1 illustrates a light ray 130 that is incident on a reflective film 110 at an angle of incidence θ, thereby forming a plane of incidence 132. The reflective film 110 includes a first reflection axis 116 that is parallel to the x-axis, and a second reflection axis 114 that is parallel to the y-axis. The plane of incidence 132 of ray 130 is parallel to the first reflection axis 116. Ray 130 has a p-polarized component that is in the plane of incidence 132, and an s-polarized component that is orthogonal to the plane of incidence 132. The p-polarized light of ray 130 will be reflected by the reflective film with a reflectivity of $R_{pp-x}$ (the projection of the electric field of the p-polarized light of ray 130 onto the plane of reflective film 110 is parallel to the x-direction), while the s-polarized light of ray 130 is reflected by the reflective film with a reflectivity of $R_{ss-y}$ (the electric field of the s-polarized light of ray 130 is parallel to the y-direction).

Further, FIG. 1 illustrates ray 120 that is incident on the reflective film in a plane of incidence 122 that is parallel to the second reflection axis 114 of the film 110. Ray 120 has a p-polarized component that is in the plane of incidence 122, and an s-polarized component that is orthogonal to the plane of incidence 122. The p-polarized light of ray 120 will be reflected by the reflective film with a reflectivity of $R_{pp-y}$, while the s-polarized light of ray 120 is reflected by the reflective film with a reflectivity of $R_{ss-x}$. The amount of transmission and reflection of p- and s-polarized light, for any plane of incidence, will depend on the characteristics of reflective film.

Figure 2A:
FIGS. 2A-2F are schematic illustrations of an optical device according to exemplary implementations of the present disclosure.

FIG. 2A schematically illustrates an exemplary optical device 150. In some implementations, the optical device 150 includes an optical sensor 154, an optical filter 158 and an angle-selective filter 166. A measurement subject 170 and a light source 162 are also illustrated. In this implementation, light emitted from the light source 162 passes through all elements of the optical device 150, reflects off of the measurement subject 170 and then passes through the optical filter 158 and angle-selective filter 166 before reaching the optical sensor 154. In some implementations, the light source 162 can include one or more of an organic light-emitting diode, a mini light-emitting diode, a micro light-emitting diode, an incandescent filament, a light-emitting diode, a vertical cavity surface emitting laser or the optical sensor 154 itself can emit light.

Figure 2B:
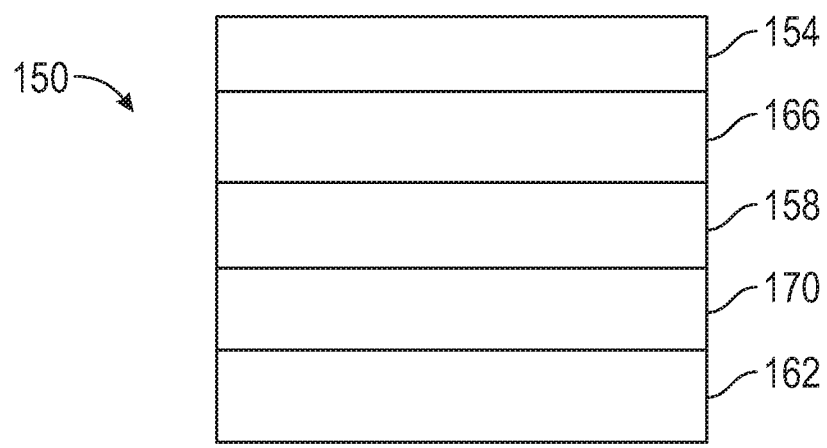

FIG. 2B illustrates another exemplary optical device 150, showing the optical sensor 154, optical filter 158, angle-selective filter 166, light source 162 and measurement subject 170 in a different configuration from that shown in FIG. 2A. In this implementation, light from the light source 162 passes through the measurement subject 170 en route to the remaining elements of the optical device 150.

Figure 2C:
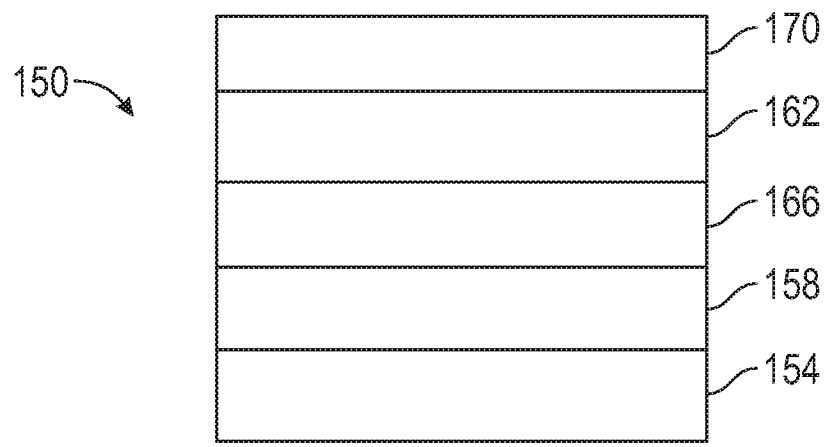

FIG. 2C illustrates another exemplary optical device 150, showing the optical sensor 154, optical filter 158, angle-selective filter 166, light source 162 and measurement subject 170 in a different configuration from that shown in FIG. 2A and FIG. 2B. The light source 162 in this implementation is a transmissive light source, whereby at least some light emitted from the transmissive light source can reflect off of a portion of the measurement subject 170 and then pass through the transmissive light source and toward the remaining elements of the optical device 150.

Figure 2D:
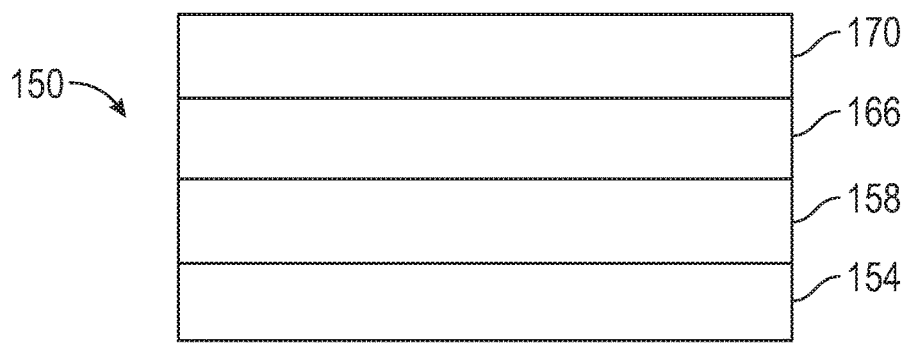

FIG. 2D illustrates another exemplary optical device 150, showing the optical sensor 154, optical filter 158, angle-selective filter 166, light source 162 and measurement subject 170 in a different configuration from that shown in FIG. 2A, FIG. 2B or FIG. 2C. This implementation does not include a light source, and light from other sources (such as ambient light) reflects off of the detectable subject before passing through elements of the optical device 150 and reaching the optical sensor 154.

Figure 2E:
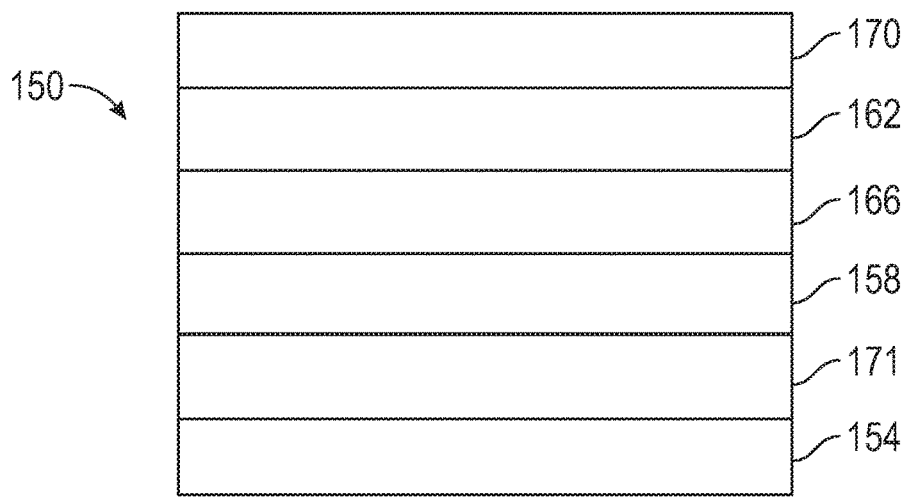

FIG. 2E illustrates another exemplary optical device 150, showing the optical sensor 154, optical filter 158, angle-selective filter 166, light source 162 and measurement subject 170 in a different configuration from that shown in FIG. 2A, FIG. 2B, FIG. 2C or FIG. 2D. The light source 162 in this implementation is a polarized transmissive light source, whereby at least some light emitted from the polarized transmissive light source can reflect off of a portion of the measurement subject 170 and then pass through the polarized transmissive light source and pass through a cross polarizer 171 such that only light, or substantially only light, reflected from the measurement subject 170 is detected by the optical sensor 154.

Figure 2F:
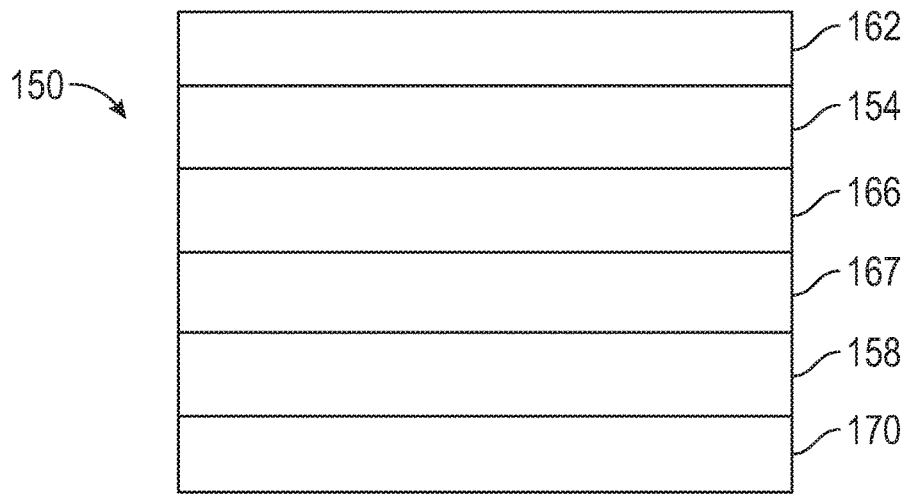

FIG. 2F illustrates another exemplary embodiment of optical device 150. In this implementation, light from the light source 162 passes through the measurement subject 170 en route to the remaining elements of the optical device 150, which include a second angle-selective filter 167 to be described below in greater detail.

It is to be understood that the aforementioned elements of the optical device 150 can be disposed in any permutation, order or arrangement, can be in contact, not in contact, adjacent, proximate or joined while still being in optical communication, and while still falling within the scope of the disclosed optical device 150. FIGS. 2A-2F merely represent exemplary implementations of the optical device 150.

Figure 3:
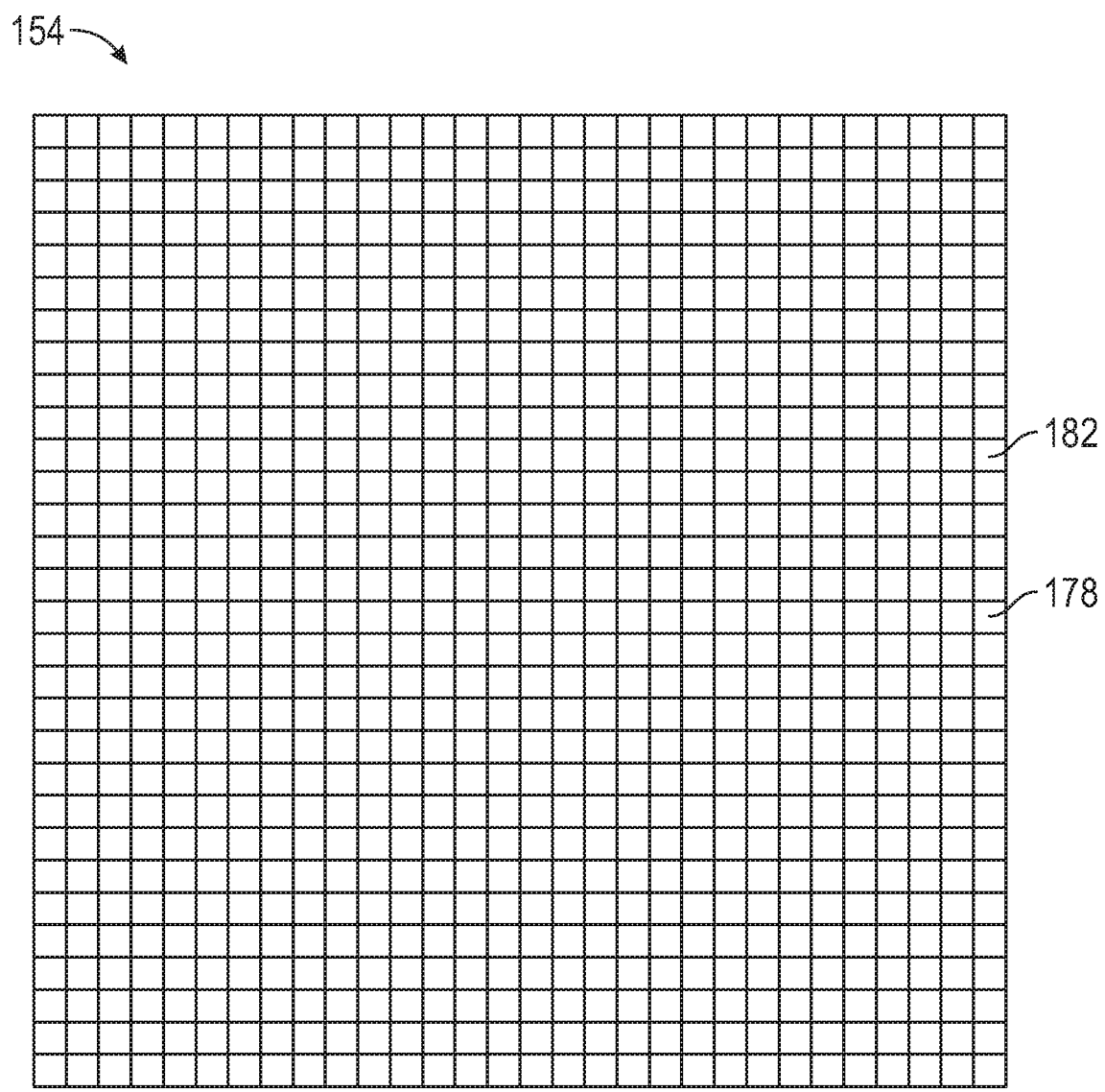
FIG. 3 is a front elevation view of an optical sensor and included pixels according to exemplary implementations of the present disclosure.

The optical sensor 154 can sense light over a single area, or can be divided into a plurality of light-gathering photosensitive picture elements, or pixels 178. These pixels 178 can be seen in exemplary FIG. 3. One or more of the pixels 178 can serve a reference pixel 182, as will be described below in further detail. The optical sensor 154 can include a charge-coupled device, a complementary-metal-oxide semiconductor or can employ any other light-sensing sensor technology. Additionally, the optical sensor 154 can include one or more photosensors, organic photosensors, photodiodes and/or organic photodiodes.

In some implementations, the optical sensor 154 is flexible. Such a flexible optical sensor 154 can have properties of being bendable without cracking. Such a flexible optical sensor 154 can also be capable of being formed into a roll. In some implementations, the flexible optical sensor 154 can be bent around a roll core with a radius of curvature of, or up to, 7.6 centimeters (cm) (3 inches), 6.4 cm (2.5 inches), 5 cm (2 inches), 3.8 cm (1.5 inches), 2.5 cm (1 inch), 1.9 cm (¾ inch), 1.3 cm (½ inch) or 0.635 cm (¼ inch).

Figure 4A:
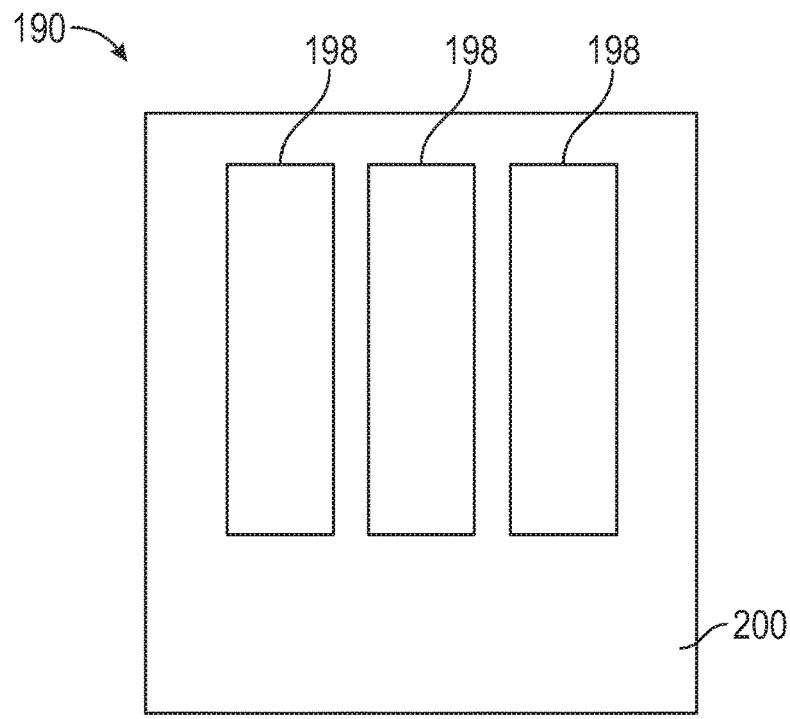
FIG. 4A is a front elevation view of a first filter sheet.
Figure 4B:
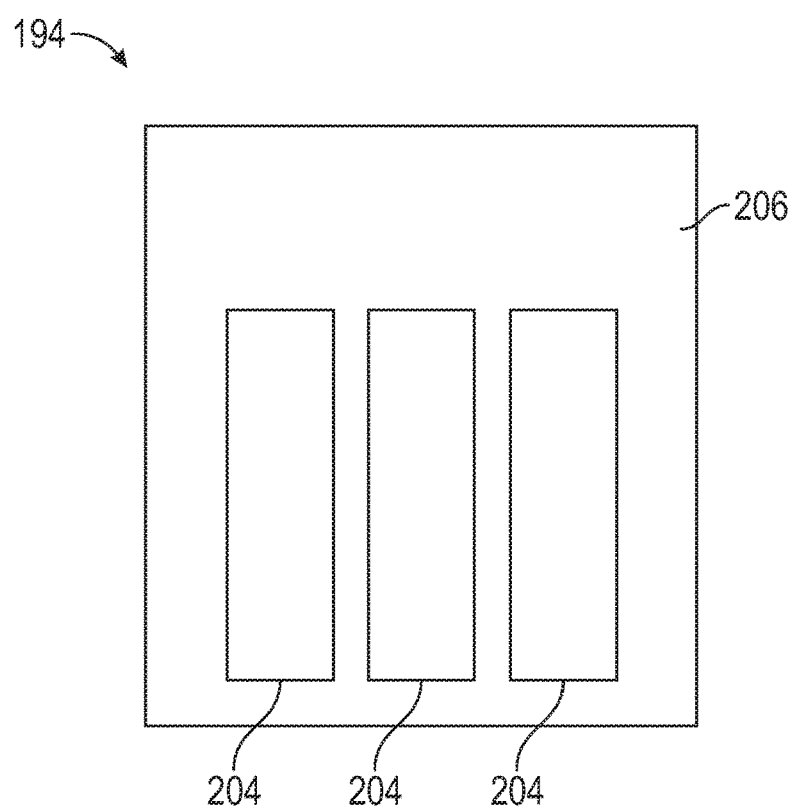
FIG. 4B is a front elevation view of a second filter sheet.

FIG. 4A shows an exemplary first filter sheet 190 and FIG. 4B shows an exemplary second filter sheet 194. The optical filter 158 can include the first filter sheet 190 and/or the second filter sheet 194. The first filter sheet 190 and second filter sheet 194 can be formed of one or more packets of optical films, as described above. One or more written regions 198 can be defined, or formed, in the first filter sheet 190. The written regions 198 can be physical apertures formed in the first filter sheet 190 through die cutting, laser ablation, heating and water jet cutting, among other processes.

Figure 4C:
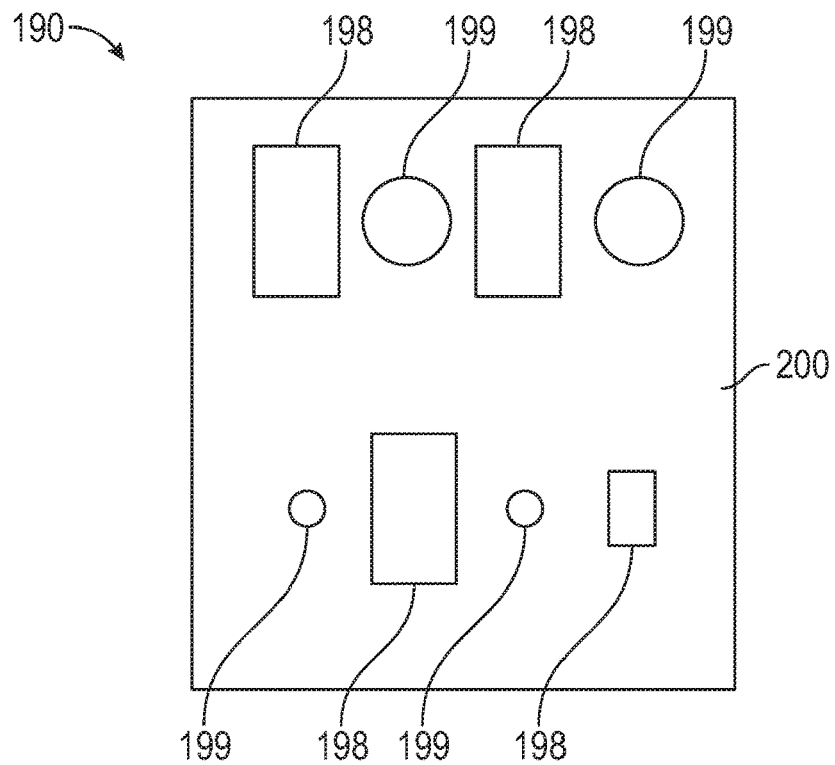
FIG. 4C is a front elevation view of another implementation of the first filter sheet according to exemplary implementations of the present disclosure.

Further, as shown in FIG. 4C, an exemplary implementation of the first filter sheet 190 includes the written regions 198 along with one or more auxiliary written regions 199. The written regions 198 and auxiliary written regions 199 can be of different sizes, shapes and/or spatial patterns on the first filter sheet 190. One or more of the auxiliary written regions 199 can be larger than one or each of the pixels 178. Further, one or more of the auxiliary written regions 199 produces or defines an auxiliary transmission spectrum, which can be the same as or different from the transmission spectrum defined, or produced, by the written regions 198. It is to be understood that the written regions 198, 204 can be formed in the same manners as the auxiliary written regions 199.

The written regions 198 can also be formed using spatially tailored optical film processes, such as those described in U.S. Pat. No. 9,810,930 (Merrill et al.), incorporated herein by reference. In particular, a laser process can locally destroy the birefringence, and thus change the optical properties and transmission spectra of written regions (such as the written regions 198). These written regions can be made completely clear, or can have a wavelength selective function (or a transmission spectrum) different from a non-written region 200 of the first filter sheet 190. One or more written regions 204 can be defined, or formed, in the second filter sheet 194 through any of the aforementioned ways that the written regions 198 are formed in the first filter sheet 190. Further, a non-written region 206 of the second filter sheet 194 is shown in FIG. 4B. Thus, the optical filter 158 can be a spatially-variant optical filter, a wavelength-selective optical filter or a spatially-variant wavelength-selective optical filter, as will be described in further detail. The written regions 198 can be of differing shapes and/or sizes within the first filter sheet 190, and the written regions 204 can be of different shapes and/or sizes within the second filter sheet 194.

The written regions 198 can be arranged in a pattern, or a repeated pattern, such that the written regions 198 are disposed in a predictable manner. Similarly, the written regions 204 can be arranged in a pattern, or a repeated pattern, such that the written regions 204 are disposed in a predictable manner. The pattern of the written regions 198 and written regions 204 may be identical, similar, dissimilar, overlapping, corresponding, partially-overlapping or unrelated when the first filter sheet 190 and second filter sheet 194 are adjacent, in contact, proximate or joined with one another. In other words, when the first filter sheet 190 and second filter sheet 194 are adjacent, in contact, proximate or joined with one another in a particular manner, the written regions 198 and written regions 204 may be overlapping, corresponding, partially-overlapping, unrelated, identical, similar or dissimilar.

Figure 5A:
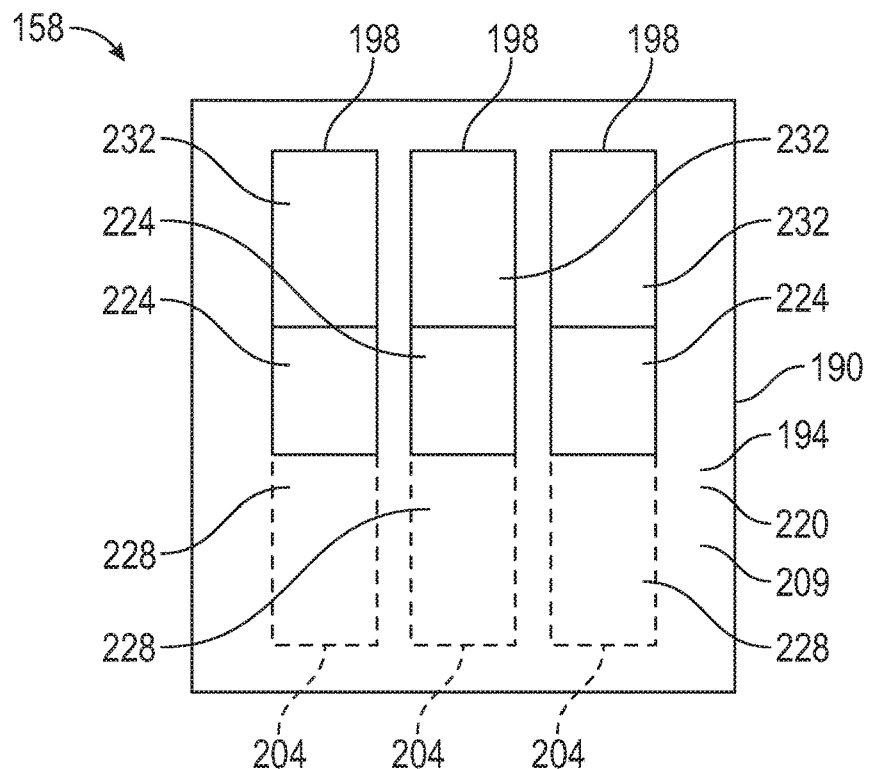
FIG. 5A is a front elevation view of the first filter sheet and second filter sheet adjacent one another and forming an optical filter.

An implementation of the optical filter 158 is shown in FIG. 5A. In some implementations, the optical filter 158 includes the first filter sheet 190 and the second filter sheet 194, and further the first filter sheet 190 and the second filter sheet 194 can be in contact, adjacent or proximate one another. In some implementations, the first filter sheet 190 and second filter sheet 194 are joined, or laminated, together by one of a number of known joining technologies including weldments, adhesives and lamination, among others.

Figure 5B:
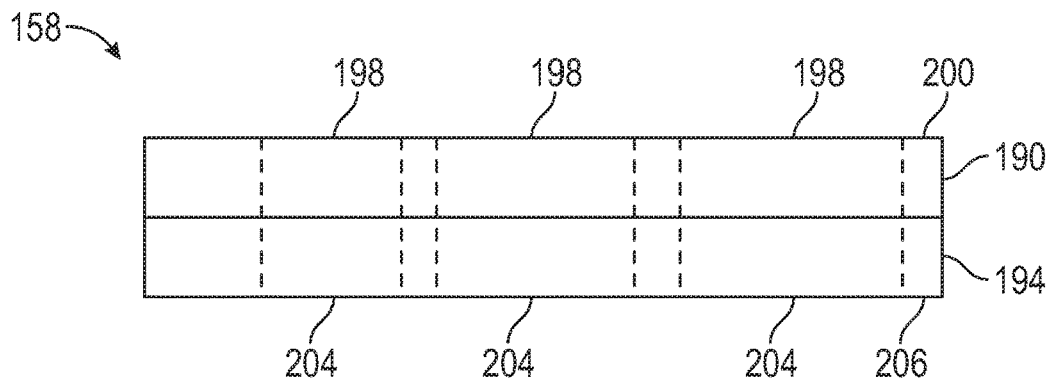
FIG. 5B is a top elevation view of the first filter sheet and second filter sheet adjacent one another and forming an optical filter and FIG. 5C is a lateral elevation view of the first filter sheet and second filter sheet adjacent one another and forming an optical filter according to exemplary implementations of the present disclosure.
Figure 5C:
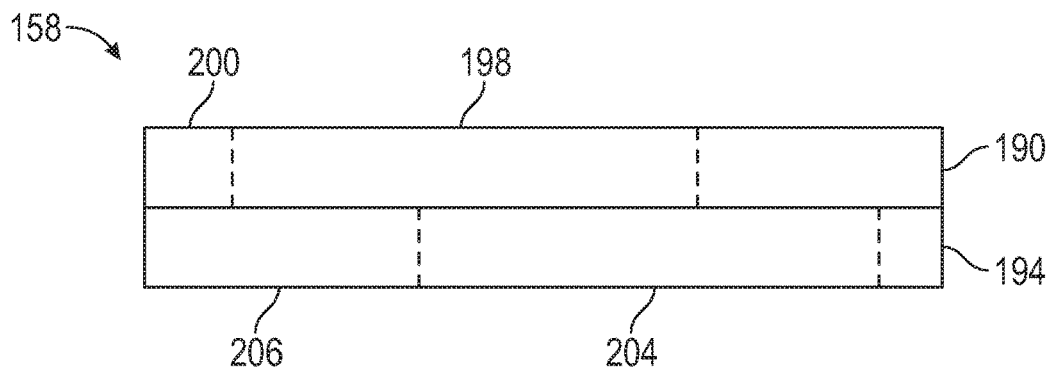

In some implementations, as shown in FIGS. 5A, 5B and 5C, when the first filter sheet 190 and second filter sheet 194 are adjacent, in contact, proximate or joined with one another in a particular manner, to thus form the optical filter 158, the written regions 198 and written regions 204 are partially-overlapping. In such an arrangement, rays of light incident on, and normal to, a front surface 209 of the optical filter 158, or to an entirety of a front surface 209 of the optical filter 158, pass through each of four different areas: a first area 220, where the incident and normal light passes through the non-written region 200 of the first filter sheet 190 and the non-written region 206 of the second filter sheet 194, a second area 224 where the incident and normal light passes through the written region 198 in the first filter sheet 190 and through the written region 204 in the second filter sheet 194, a third area 228 where the incident and normal light passes through the non-written region 200 of the first filter sheet 190 and through the written region 204 in the second filter sheet 194, and a fourth area 232 where the incident and normal light passes through the non-written region 206 of the second filter sheet 194 and through the written region 198 of the first filter sheet 190. Through such an exemplary implementation of the optical filter 158, rays of the incident and normal light can pass through each of the areas 220, 224, 228 and 232 to thereby be filtered in four different manners by varied influences of the first filter sheet 190 and second filter sheet 194.

Figure 6:
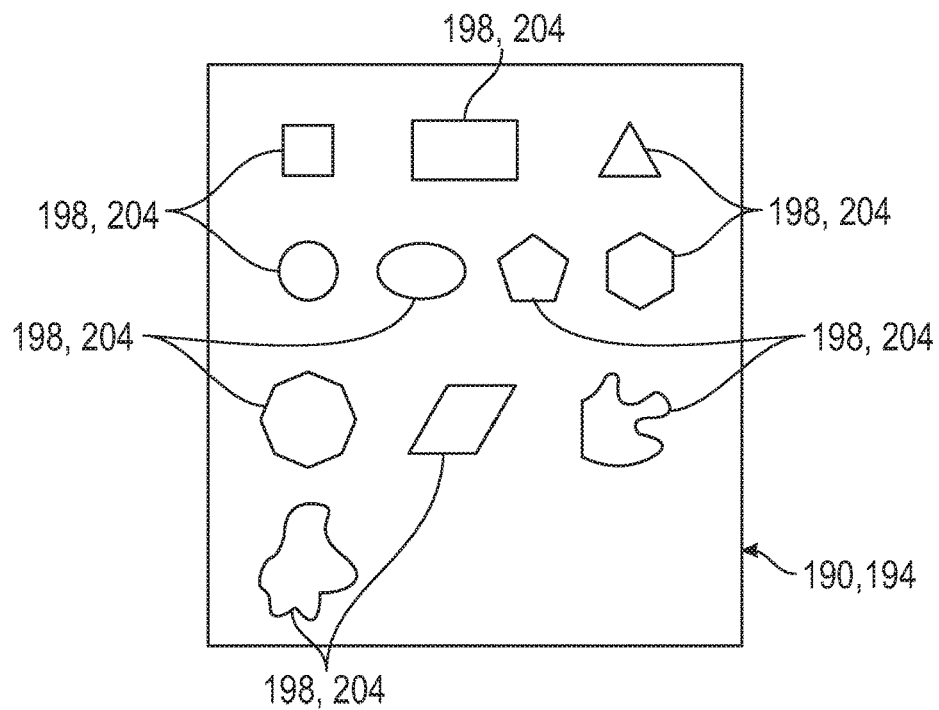
FIG. 6 is a front elevation view of an exemplary first or second filter sheet including various region shapes according to exemplary implementations of the present disclosure.

In some implementations, the written regions 198 disposed in the first filter sheet 190 and/or the written regions 204 disposed in the second filter sheet 194 can include particular shapes. For example, at least some written regions 198 disposed in the first filter sheet 190 and/or at least some written regions 204 disposed in the second filter sheet 194 can include one or more of circles, squares, triangles, ovals, rectangles, pentagons, hexagons, heptagons, octagons, organic shapes, partially-organic shapes, parallelograms, polygons and non-polygonal organic shapes. Examples of these shapes are shown, in non-limiting fashion, in FIG. 6. It is to be understood that one or more of the written regions 198 in the first filter sheet 190 and the written regions 204 in the second filter sheet 194 can form one or more of these shapes, in any order, arrangement or permutation. Further, one or more of the written regions 198 in the first filter sheet 190 and the written regions 204 in the second filter sheet 194 can be the same shape or can be different shapes.

In some implementations, the written regions 198 in the first filter sheet 190 and/or the written regions 204 in the second filter sheet 194 can include particular sizes. Further, one or more of the written regions 198 in the first filter sheet 190 and the written regions 204 in the second filter sheet 194 can be the same size or can be different sizes. Individual sizes of the written region can vary depending on the sensing application, but can be chosen to be larger than the pixel 178 size used in the optical sensor 154 so that multiple pixels 178 are used to collect the light to increase detection power for the spectral region defined by the written region. The optical sensor pixels 178 can then be grouped by hardware or software methods to align those pixels 178 to the written region resulting in spectral-spatial mapping of the measurement layer, or measurement subject. Any one or more of the written regions 198, 204, auxiliary written regions 199 and/or areas 220, 224, 228, 232 can be larger than one pixel 178, than two pixels, 178, than five pixels 178, than ten pixels 178, than one hundred pixels 178, than one thousand pixels 178 or than any number of pixels 178 in certain implementations.

Figure 7:
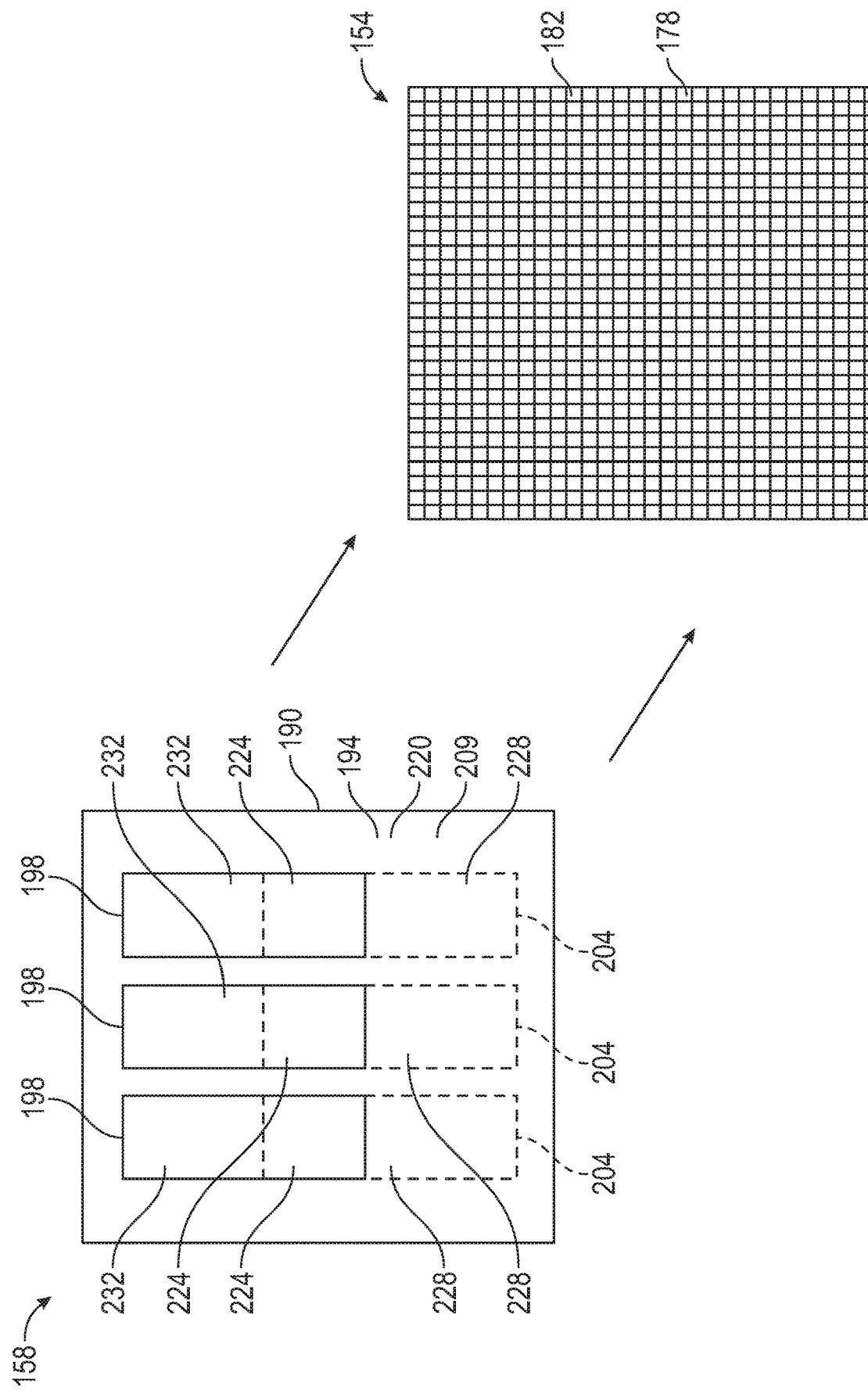
FIG. 7 illustrates a schematic view of the optical filter and the optical sensor according to exemplary implementations of the present disclosure.
Figure 8:
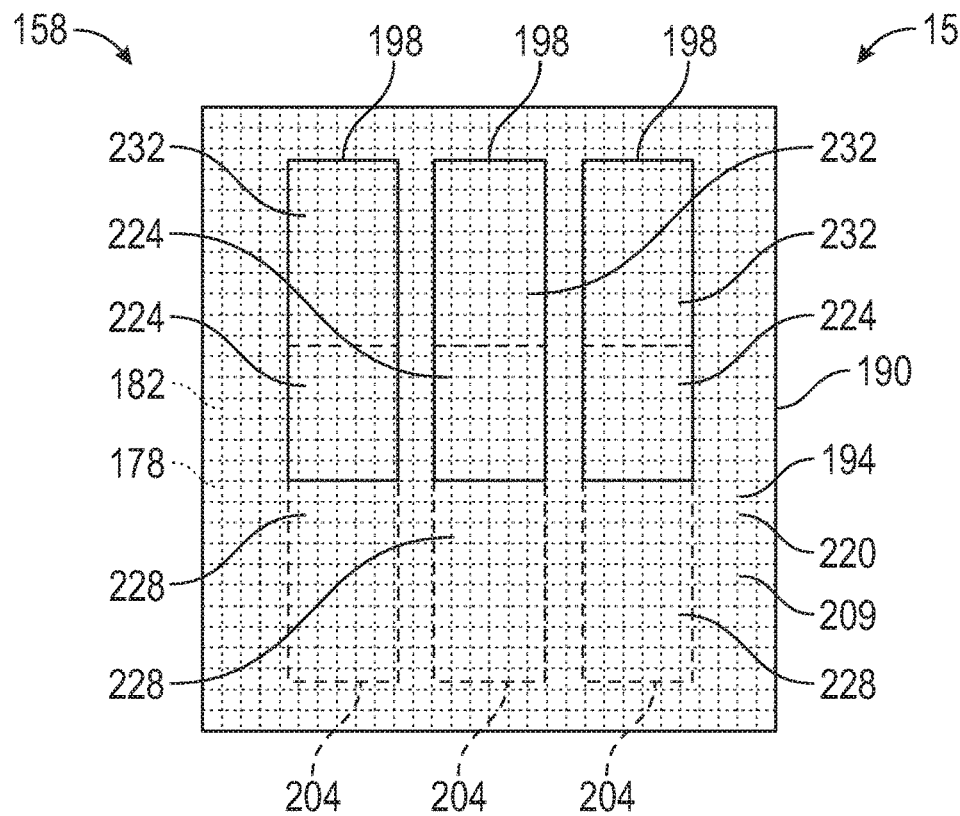
FIG. 8 illustrates the optical filter proximate the optical sensor, further showing relative positions of regions, areas and pixels, according to exemplary implementations of the present disclosure.

As shown in FIG. 7, the optical filter 158 may be in optical communication with the optical sensor 154. In other words, light incident on the optical filter 158 may pass through one or more areas (220, 224, 228, 232) of the optical filter 158 and then reach the optical sensor 154. The optical filter 158 may be adjacent, in contact with, joined with, proximate or distal to the optical sensor 154 while still residing in optical communication with the optical sensor 154. FIG. 7 illustrates the optical filter 158 and the optical sensor 154, whereby the optical sensor is brought proximate, or adjacent, the optical sensor 154. FIG. 8 illustrates a possible relationship between the optical filter 158 and the optical sensor 154, where the optical sensor 154 is proximate, adjacent or in contact with the optical filter 158.

It can be seen in FIGS. 7 and 8 that, in some implementations, at least some of the pixels 178 are smaller than the written regions 198 in the first filter sheet 190, the written regions 204 in the second filter sheet 194, the first area 220, the second area 224, the third area 228 and/or the fourth area 232. Further, in some implementations, each of the pixels 178 is smaller than the written regions 198 in the first filter sheet 190, the written regions 204 in the second filter sheet 194, the first area 220, the second area 224, the third area 228 and/or the fourth area 232. At least one pixel 178 can be in optical communication with one of the written regions 198, written regions 204, first area 220, second area 224, third area 228 and fourth area 232, depending on the makeup of the optical filter 158, such that light incident on the optical device 150 and influenced by an aforementioned portion of the optical filter 158 is registered to, and recorded by, at least one pixel 178. Additionally, as described earlier, the presence of other elements (such as the light source 162 or angle-selective filter 166) does not preclude the optical filter 158 from being in optical communication with the optical sensor 154, even if the optical filter 158 is not adjacent, in contact with or proximate the optical sensor 154.

Each portion of the first filter sheet 190, second filter sheet 194 and optical filter 158 defines, or produces, a transmission spectrum or transmission spectra. It is to be understood that such a transmission spectrum or spectra defines a wavelength range of light which is transmitted, substantially transmitted, 90% transmitted, substantially 90% transmitted or partially transmitted. Similarly, light having a wavelength outside of the transmission spectrum or spectra is blocked, substantially blocked or partially blocked. In some implementations, a visible spectrum is defined as 400 nm-700 nm, or approximately 400 nm-700 nm, a near-infrared spectrum is defined as 700 nm-2000 nm, or approximately 700 nm-2000 nm, and a near-ultraviolet spectrum is defined as 350 nm-400 nm, or approximately 350 nm-400 nm.

In some implementations, the transmission spectrum of the non-written region 200 of the first filter sheet 190 is, or includes, the visible spectrum, the near-ultraviolet spectrum and/or the near-infrared spectrum. In some implementations, the transmission spectrum of the non-written region 200 of the first filter sheet 190 is, or includes, approximately the visible spectrum, approximately the near-ultraviolet spectrum and/or approximately the near-infrared spectrum. In some implementations, the transmission spectrum of the non-written region 206 of the second filter sheet 194 is, or includes, the visible spectrum, the near-ultraviolet spectrum and/or the near-infrared spectrum. In some implementations, the transmission spectrum of the non-written region 206 of the second filter sheet 194 is, or includes, approximately the visible spectrum, approximately the near-ultraviolet spectrum and/or approximately the near-infrared spectrum.

In some implementations, the transmission spectrum of the written region 198 of the first filter sheet 190 is, or includes, the visible spectrum, the near-ultraviolet spectrum and/or the near-infrared spectrum. In some implementations, the transmission spectrum of the written region 198 of the first filter sheet 190 is, or includes, approximately the visible spectrum, approximately the near-ultraviolet spectrum and/or approximately the near-infrared spectrum. In some implementations, the transmission spectrum of the auxiliary written region 199 of the first filter sheet 190 is, or includes, the visible spectrum, the near-ultraviolet spectrum and/or the near-infrared spectrum. In some implementations, the transmission spectrum of the auxiliary written region 199 of the first filter sheet 190 is, or includes, approximately the visible spectrum, approximately the near-ultraviolet spectrum and/or approximately the near-infrared spectrum. In some implementations, the transmission spectrum of the written region 204 of the second filter sheet 194 is, or includes, the visible spectrum, the near-ultraviolet spectrum and/or the near-infrared spectrum. In some implementations, the transmission spectrum of the written region 204 of the second filter sheet 194 is, or includes, approximately the visible spectrum, approximately the near-ultraviolet spectrum and/or approximately the near-infrared spectrum.

In some implementations, the transmission spectrum of the first area 220 is, or includes, the visible spectrum, the near-ultraviolet spectrum and/or the near-infrared spectrum. In some implementations, the transmission spectrum of the first area 220 is, or includes, approximately the visible spectrum, approximately the near-ultraviolet spectrum and/or approximately the near-infrared spectrum. In some implementations, the transmission spectrum of the second area 224 is, or includes, the visible spectrum, the near-ultraviolet spectrum and/or the near-infrared spectrum. In some implementations, the transmission spectrum of the second area 224 is, or includes, approximately the visible spectrum, approximately the near-ultraviolet spectrum and/or approximately the near-infrared spectrum. In some implementations, the transmission spectrum of the third area 228 is, or includes, the visible spectrum, the near-ultraviolet spectrum and/or the near-infrared spectrum. In some implementations, the transmission spectrum of the third area 228 is, or includes, approximately the visible spectrum, approximately the near-ultraviolet spectrum and/or approximately the near-infrared spectrum. In some implementations, the transmission spectrum of the fourth area 232 is, or includes, the visible spectrum, the near-ultraviolet spectrum and/or the near-infrared spectrum. In some implementations, the transmission spectrum of the fourth area 232 is, or includes, approximately the visible spectrum, approximately the near-ultraviolet spectrum and/or approximately the near-infrared spectrum.

In some implementations, the transmission spectrum of one or more of the first, second, third or fourth areas (220, 224, 228, 232) is, substantially is, substantially includes or includes, the same transmission spectrum as one or more of the others of the first, second, third or fourth areas (220, 224, 228, 232). In some implementations, the transmission spectrum of one or more of the first, second, third or fourth areas (220, 224, 228, 232) is distinct, substantially distinct, substantially partially distinct or partially distinct, from the transmission spectrum as one or more of the others of the first, second, third or fourth areas (220, 224, 228, 232).

In some implementations, the optical filter 158 (which can be a wavelength-selective optical filter) includes a first plurality of areas, or of spatially-variant areas, which can be one or more of the first, second, third or fourth areas (220, 224, 228, 232) and a second plurality of areas, or of spatially-variant areas, which can be one or more of the first, second, third or fourth areas (220, 224, 228, 232). The areas of the first plurality of areas, or of spatially-variant areas, can have a transmission spectrum different from that of the areas of the second plurality of areas, or of spatially-variant areas.

In some implementations, the optical filter 158 is flexible. Such a flexible optical filter 158 can have properties of being bendable without cracking. Such a flexible optical filter 158 can also be capable of being formed into a roll. In some implementations, the flexible optical filter 158 can be bent around a roll core with a radius of curvature of up to 7.6 centimeters (cm) (3 inches), 6.4 cm (2.5 inches), 5 cm (2 inches), 3.8 cm (1.5 inches), 2.5 cm (1 inch), 1.9 cm (¾ inch), 1.3 cm (½ inch) or 0.635 cm (¼ inch).

Further, the optical sensor 154 may be active in a particular wavelength range. In other words, the optical sensor 154 may absorb and electronically register incident light, optimally absorb and electronically register incident light or partially absorb and electronically register incident light in the visible spectrum, the near-ultraviolet spectrum and/or the near-infrared spectrum.

As described, one or more of the pixels 178 may be, or serve as, the reference pixel 182. The reference pixel 182 can be used to reference one or more wavelengths to a lookup table of known thresholds or values. Such a reference pixel 182 can be used to calibrate the optical device 150 and to ensure measurement conditions remain acceptable before, during and/or after a measurement is performed.

In some implementations, the optical device 150 includes the angle-selective filter 166. The angle-selective filter 166 limits an angle of light transmission through the angle-selective filter 166 such that light rays greater than a certain incident angle, greater than an approximate incident angle, less than a certain incident angle, less than an approximate incident angle, greater than a first incident angle and less than a second incident angle and greater than an approximate first incident angle and less than a second approximate incident angle are blocked, substantially blocked or partially blocked from transmitting through the angle-selective filter 166.

Figure 9A:
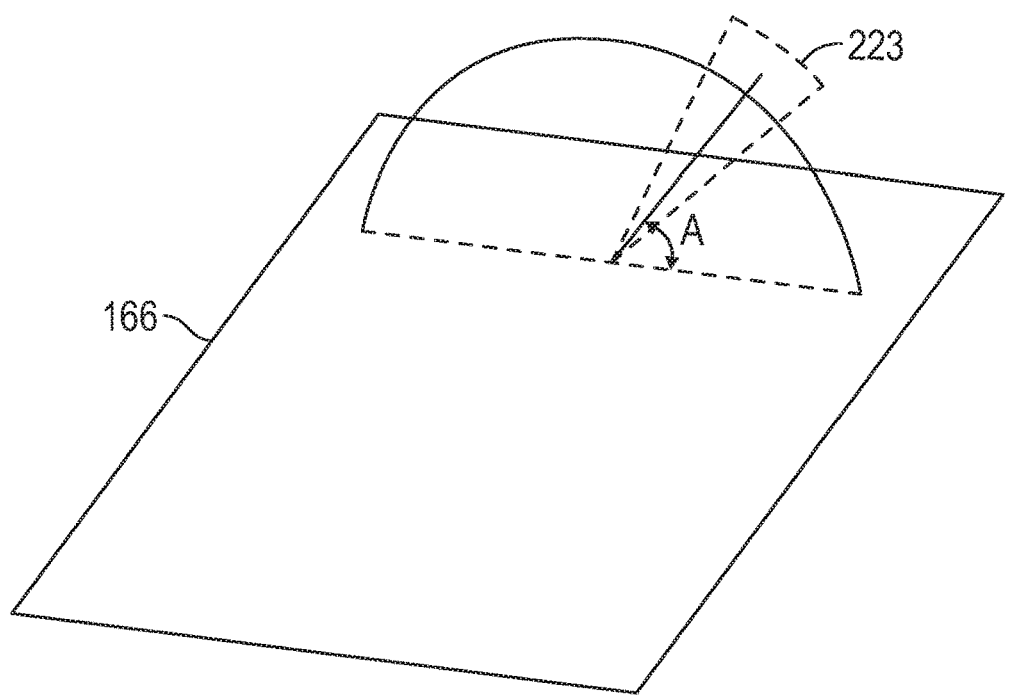
FIG. 9A illustrates an angle-selective filter centered around angle A, according to exemplary implementations of the present disclosure.

In some implementations, as shown in FIG. 9A, the angle-selective filter 166 is centered around a particular angle A, meaning a range of light rays 223 incident to the angle-selective filter 166 is centered around A degrees as measured from the angle-selective filter 166. In some implementations, angle A equals 5, 10, 15, 20, 25, 30, 35, 40, 45, 50, 55, 60, 65, 70, 75, 80 or 85 degrees. In some implementations, angle A equals approximately 5, 10, 15, 20, 25, 30, 35, 40, 45, 50, 55, 60, 65, 70, 75, 80 or 85 degrees.

Figure 9B:
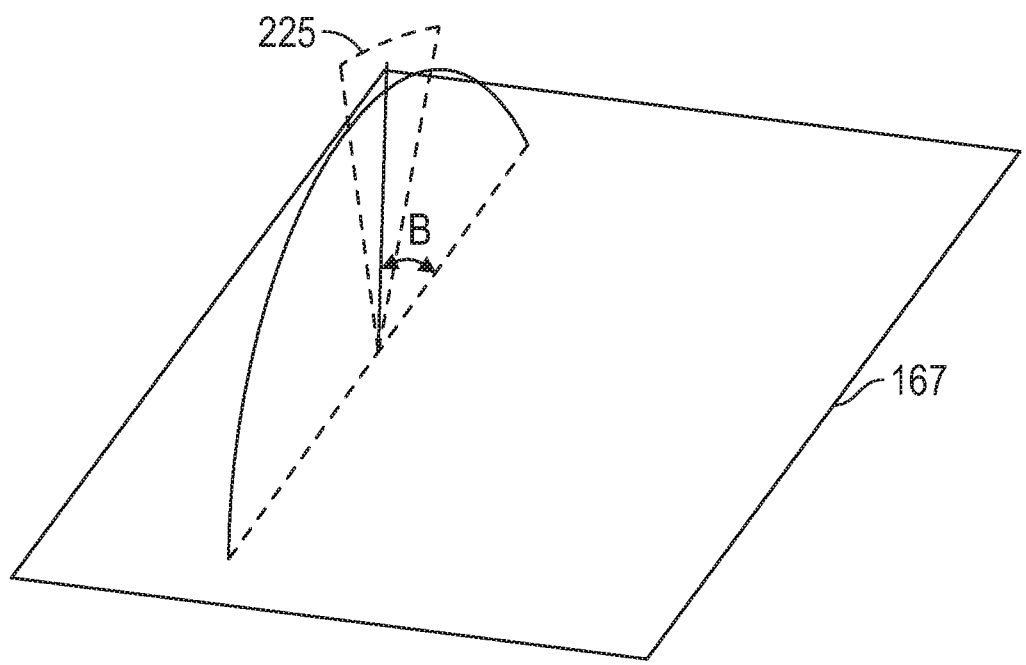
FIG. 9B illustrates a second angle-selective filter centered around angle B, according to exemplary implementations of the present disclosure.

In some implementations, as shown in FIG. 9B, the second angle-selective filter 167 is used in the optical device 150 in addition to the angle-selective filter 166. The second angle-selective filter 167 can be centered around a particular angle B, meaning a range of light rays 225 incident to the second angle-selective filter 167 is centered around B degrees as measured from the second angle-selective filter 167. In some implementations, angle B equals 5, 10, 15, 20, 25, 30, 35, 40, 45, 50, 55, 60, 65, 70, 75, 80 or 85 degrees. In some implementations, angle B equals approximately 5, 10, 15, 20, 25, 30, 35, 40, 45, 50, 55, 60, 65, 70, 75, 80 or 85 degrees.

Figure 9C:
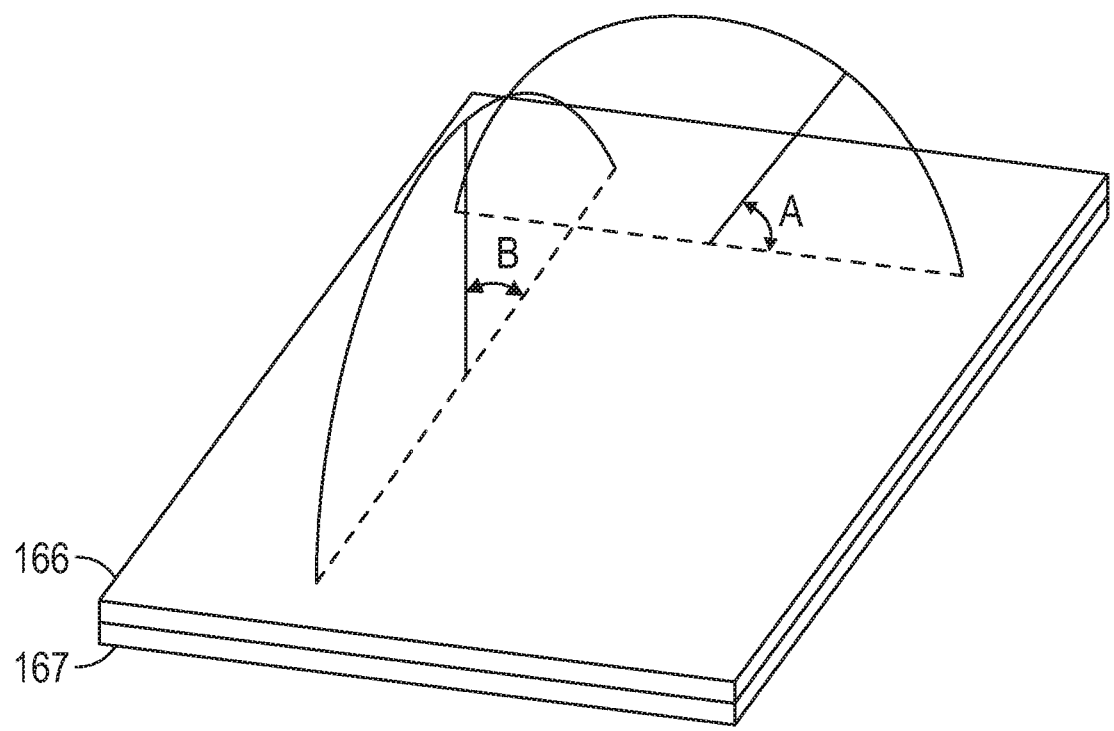
FIG. 9C illustrates the first and second angle-selective filters centered around angles A and B, respectively, and where arcs defining a range of possible angle A measurements and possible angle B measurements define perpendicular planes, according to exemplary implementations of the present disclosure.

Further, the angle-selective filter 166 and second angle-selective filter 167 can be disposed such that arcs defining a range of possible angle A measurements and possible angle B measurements define perpendicular planes, as shown in FIG. 9C, when the angle-selective filter 166 and second angle-selective filter 167 are in contact, proximate, adjacent or joined in a parallel and/or planar-parallel fashion. In some implementations, any other angle can be formed between planes defined by the arc defining a range of possible angle A measurements and the arc defining a range of possible angle B measurements.

Figure 10:
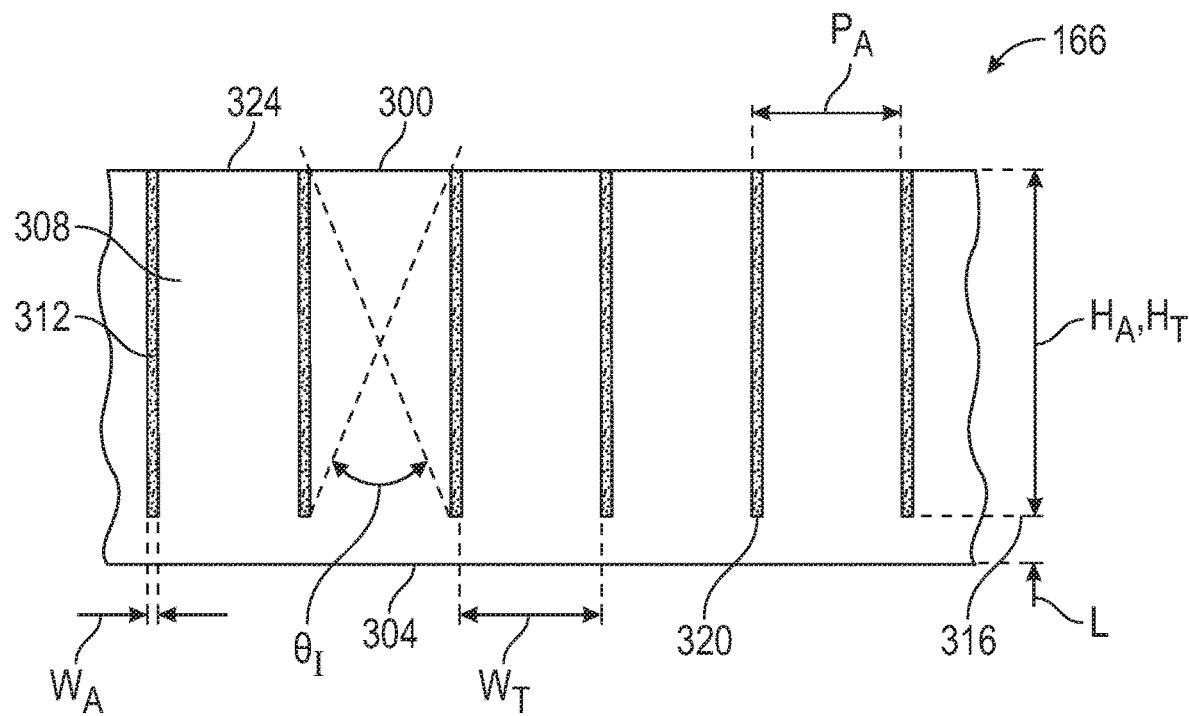
FIG. 10 and FIG. 11 schematically illustrates portions of the angle-selective filter according to exemplary implementations of the present disclosure.

With reference to FIG. 10, a cross-sectional view of an exemplary angle-selective filter 166, or light control film (LCF), 166 is shown. The angle-selective filter 166 includes a light output surface 300 and an opposing light input surface 304. The light output surface 300 can be parallel to the light input surface 304. Angle-selective filter 166 includes alternating transmissive regions 308 and absorptive regions 312 disposed between the light output surface 300 and a light input surface 304.

In some embodiments, as depicted in FIG. 10, the transmissive regions 308 are typically integral with a land region "L", meaning that there is no interface between the land region and the base portion 316 of the transmissive regions 308. Alternatively, the angle-selective filter may lack such land region L or an interface may be present between the land region, L, and transmissive regions 308. In some embodiments, the land region is disposed between the alternating transmissive regions 308 and absorptive regions 312, and the light input surface 304.

In some embodiments, surface 300 is the light input surface and surface 304 may be the light output surface. In such an embodiment, the land region is disposed between the alternating transmissive regions 308 and absorptive regions 312, and the light output surface.

The transmissive regions 308 can be defined by a width "$W_T$". Excluding the land region "L", the transmissive regions 308 typically have nominally the same height as the absorptive regions 312. In typical embodiments, the height of the absorptive regions, $H_A$, is at least 30, 40, 50, 60, 70, 80, 90 or 100 microns. In some embodiments, the height is no greater than 200, 190, 180, 170, 160 or 150 microns. In some embodiments, the height is no greater than 140, 130, 120, 110 or 100 microns. The angle-selective filter typically comprises a plurality of transmissive regions having nominally the same height and width. In some embodiments, the transmissive regions have a height, "$H_T$", a maximum width at its widest portion, "$W_T$", and an aspect ratio, $H_T/W_T$, of at least 1.75. In some embodiments, $H_T/W_T$ is at least 2.0, 2.5, 3.0, 3.5, 4.0, 4.5 or 5.0. In other embodiments, the aspect ratio of the transmissive regions is at least 6, 7, 8, 9 or 10. In other embodiments, the aspect ratio of the transmissive regions is at least 15, 20, 25, 30, 35, 40, 45 or 50.

Absorptive regions 312 have a height "$H_A$" defined by the distance between a bottom surface 320 and top surface 324, such top and bottom surfaces typically being parallel to the light output surface 300 and light input surface 304. The absorptive regions 312 have a maximum width $W_A$ and are spaced apart along the light output surface 300 by a pitch "$P_A$".

The width of the absorptive regions, $W_A$, at the base (i.e. adjacent bottom surface 320) is typically nominally the same as the width of the absorptive regions adjacent the top surface 324. However, when the width of the absorptive regions at the base differs from the width adjacent the top surface, the width is defined by the maximum width. The maximum width of a plurality of absorptive regions can be averaged for an area of interest, such as an area in which the transmission (e.g. brightness) is measured. The angle-selective filter typically comprises a plurality of absorptive regions having nominally the same height and width. In typical embodiments, the absorptive regions generally have a width no greater than 10, 9, 8, 7, 6, 5, 4, 3, 2 or 1 micron. In some embodiments, the absorptive regions generally have a width no greater than 900, 800, 700, 600 or 500 nanometers. In some embodiments, the absorptive regions have a width of at least 50, 60, 70, 80, 90 or 100 nanometers.

An absorptive region can be defined by an aspect ratio, the height of the absorptive region divided by the maximum width of the absorptive region ($H_A/W_A$). In some embodiments, the aspect ratio of the absorption regions is at least 1, 2, 3, 4, 5, 6, 7, 8, 9 or 10. In some embodiments, the height and width of the absorptive region(s) are selected such that the absorptive region(s) have an even higher aspect ratio. In some embodiments, the aspect ratio of the absorption regions is at least 15, 20, 25, 30, 35, 40, 45, 50, 55, 60, 65, 70, 75, 80, 85, 90, 95 or 100. In other embodiments, the aspect ratio of the absorption regions is at least 200, 300, 400 or 500. The aspect ratio can range up to 10,000 or greater. In some embodiments, the aspect ratio is no greater than 9,000, 8,000, 7,000, 6,000, 5,000, 4,000, 3000, 2,000 or 1,000.

Figure 11:
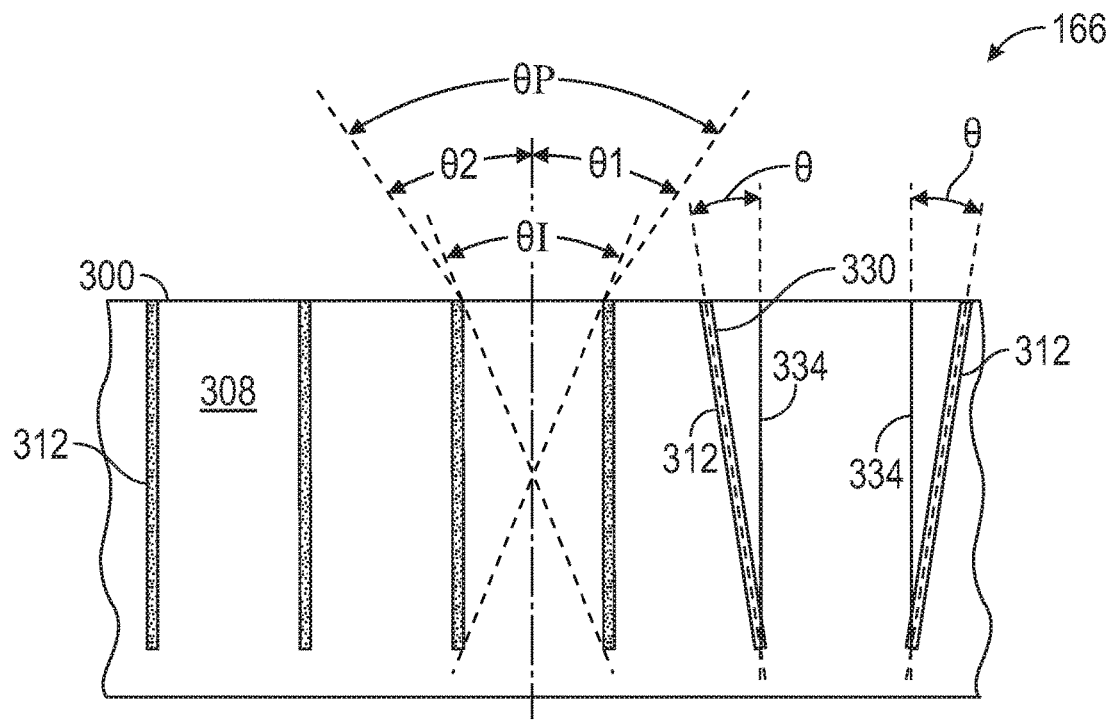

As shown in FIG. 11, angle-selective filter 166 includes alternating transmissive regions 308 and absorptive regions 312, and an interface 330 between transmissive regions 308 and absorptive regions 312. Interface 330 forms a wall angle θ with line 334 that is perpendicular to light output surface 300.

Larger wall angles θ decrease transmission at normal incidence, or at a viewing angle of 0 degrees. Smaller wall angles are preferred such that the transmission of light at normal incidence can be made as large as possible. In some embodiments, the wall angle θ is less than 10, 9, 8, 7, 6 or 5 degrees. In some embodiments, the wall angle is no greater than 2.5, 2.0. 1.5, 1.0, 0.5 or 0.1 degrees. In some embodiments, the wall angle is zero or approaching zero. When the wall angle is zero, the angle between the absorptive regions and light output surface 300 is 90 degrees. Depending on the wall angle, the transmissive regions can have a rectangular or trapezoidal cross-section.

The transmission (e.g. brightness) can be increased when incident light undergoes total internal reflection (TIR) from the interface between the absorptive and transmissive regions. Whether a light ray will undergo TIR or not can be determined from the incidence angle with the interface, and the difference in refractive index of the materials of the transmissive and absorptive regions.

As shown in FIG. 11, transmissive regions 308 between absorptive regions 312 have an interface angle $θ_I$ defined by the geometry of alternating transmissive regions 308 and absorptive regions. The polar cut-off viewing angle θP can be equal to the sum of a polar cut-off viewing half angle θ1 and a polar cut-off viewing half angle θ2, each of which are measured from the normal to light input surface 304. In typical embodiments, the polar cut-off viewing angle θP is symmetric, and polar cut-off viewing half angle θ1 is equal to polar viewing half angle θ2. Alternatively, the polar cut-off viewing angle θP can be asymmetric and polar cut-off viewing half angle θ1 is not equal to polar cut-off viewing half angle θ2.

The alternating transmissive and absorptive regions or total angle-selective filter can exhibit increased relative transmission (e.g. brightness) at a viewing angle of 0 degrees. In some embodiments, the relative transmission (e.g. brightness) is at least 75, 80, 85 or 90%. The relative transmission (e.g. brightness) is typically less than 100%. In typical embodiments, the angle-selective filter has significantly lower transmission at other viewing angles. For example, in some embodiments, the relative transmission (e.g. brightness) at a viewing angle of −30 degrees, +30 degrees, or an average of −30 degrees and +30 degrees is less than 50, 45, 40, 35, 30 or 25%. In other embodiments, the relative transmission (e.g. brightness) at a viewing angle of 30 degrees, +30 degrees, or the average of −30 degrees and +30 degrees is less than 25, 20, 15, 10 or 5%. In some embodiments, the relative transmission (e.g. brightness) at a viewing angle of +/−35, +/−40, +/−45, +/−50, +/−55, +/−60, +/−65, +/−70, +/−75 or +/−80 degrees is less than 25, 20, 15, 10 or 5%, or less than 5%. In some embodiments, the average relative transmission (e.g. brightness) for viewing angles ranging from +35 to +80 degrees, −35 to −80 degrees, or the average of these ranges is less than 10, 9, 8, 7, 6, 5, 4, 3 or 2%.

In some implementations, the absorptive regions 312 can be formed by coating a surface of a microstructured film. Further, in some implementations, the angle-selective filter 166 and/or second angle-selective filter 167 can include refractive structures. The angle-selective filter 166 can improve wavelength resolution over gradual transitions that are typical of absorptive solutions.

In some implementations, the optical device 150, optical filter 158 and/or angle-selective filter 166 defines, produces or includes a spectrally sharp transition. In contrast to a common reflective film having moderately sloped band edges, which can cause reflections or passing outside of a desired wavelength range, a spectrally sharp transition provides a more sudden change in a percentage of light blocked or reflected to reduce or eliminate light reflections or passing outside of a desired wavelength range. In some implementations, such a spectrally sharp transition occurs in less than, or less than about, 75 nm, 50 nm, 40 nm, 30 nm, 20 nm or 10 nm. In some implementations, a spectrally sharp transition includes, or includes about, a 70%, 75%, 80%, 85%, 90%, 95% or 99% change in transmission. In some implementations, a spectrally sharp transition occurs in less than, or less than about, 75 nm, 50 nm, 40 nm, 30 nm, 20 nm or 10 nm and includes, or includes about, a 70%, 75%, 80%, 85%, 90%, 95% or 99% change in transmission.

FIGS. 12A-12E show exemplary optical thickness variations for optical repeat units $R_1$ and $R_2$ in multilayer stacks $M_1$ and $M_2$ to obtain bandedge sharpening at ends of a desired reflection band, or passing band.

To obtain bandedge sharpening in accordance with the present disclosure at a first edge of the reflection band, a multilayer stack M1 having an optical repeating unit R1 is combined with a multilayer stack M2 having an optical repeating unit R2. Both multilayer stacks are designed to have a first order reflection band in a desired wavelength region. It is possible to produce a film or other optical body having a first order reflection band in a particular region of the spectrum by selecting polymeric materials with appropriate indices of refraction and by manipulating the physical thickness of each of the individual polymeric layers of an optical repeating unit such that the optical thickness of the optical repeating unit appears at the desired wavelength. By varying the optical thickness of the optical repeating unit in the multilayer film, the desired reflection over a particular range in the spectrum can be obtained. The optical repeating unit R1 of multilayer stack M1 can be monotonically varied in optical thickness such that the desired reflection band is obtained. However, it is also possible to use several multilayer stacks comprising different optical repeating units to cover a desired reflection band.

The optical thickness of optical repeating unit R1 may increase monotonically along the thickness of multilayer stack M1. Multilayer stack M2 may include an optical repeating unit R2 that is substantially constant in optical thickness or the optical thickness of optical repeating unit R2 may decrease monotonically along the thickness of multilayer stack M2. If the optical thickness of optical repeating unit R2 is substantially constant, the optical thickness thereof should be approximately equal to the minimum optical thickness of optical repeating unit R1 along the thickness of multilayer stack M1. The optical thickness of optical repeating unit R2 can be substantially equal to the minimum optical thickness of optical repeating unit R1.

Figure 12A:
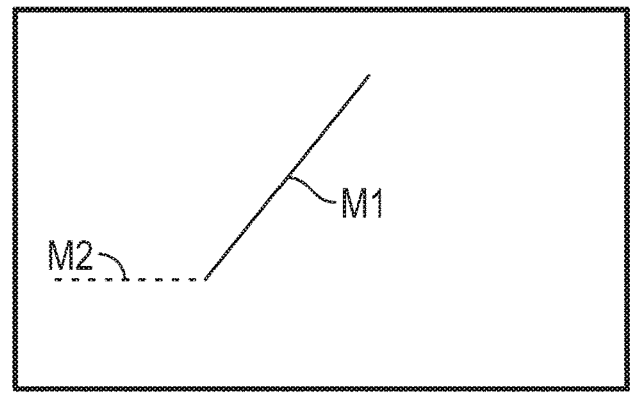
FIG. 12A-12E illustrate exemplary optical thickness variations for optical repeat units in multilayer stacks to obtain bandedge sharpening at ends of a desired wavelength band according to exemplary implementations of the present disclosure.

FIG. 12A a depicts an exemplary plot of the optical thickness of optical repeating units R1 and R2 versus the optical repeating unit number in a reflective film made in connection with the present disclosure. In FIG. 12A, multilayer stack M1 includes optical repeating unit R1 of increasing optical thickness, and multilayer stack M2 includes optical repeating unit R2 of substantially constant optical thickness. A reflective film designed in accordance with FIG. 12A will have a sharpened bandedge on a blue side, or a smaller wavelength side, of the reflection band.

Figure 12B:
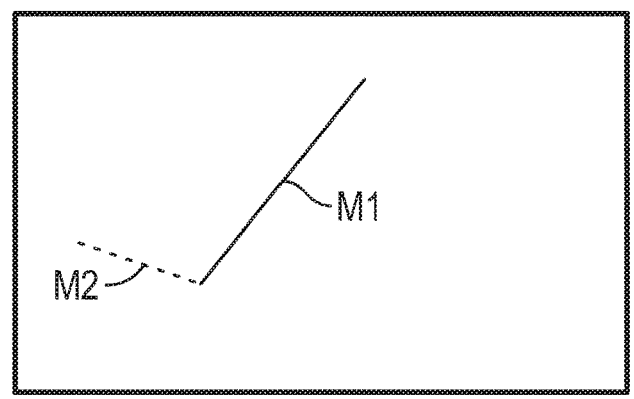

FIG. 12B depicts another exemplary embodiment of the present disclosure that also leads to sharpening of the reflection band on the blue side, or smaller wavelength side. As shown in FIG. 12B, multilayer stack M2 in this embodiment comprises an optical repeating unit R2 that decreases monotonically in optical thickness along the thickness of multilayer stack M2. The minimum optical thickness of optical repeating unit R2 in this embodiment is such that it is substantially equal to the minimum optical thickness of optical repeating unit R1 along multilayer stack M1.

To obtain bandedge sharpening in accordance with the present disclosure at the red end, or larger wavelength end, of the reflection band, a multilayer stack M1 having an optical repeating unit R1 is combined with a multilayer stack M2 having an optical repeating unit R2. Both multilayer films are designed to have a first order reflection in a desired portion of the spectrum.

The optical thickness of optical repeating unit R1 preferably increases monotonically along the thickness of multilayer stack M1. Multilayer stack M2 may include an optical repeating unit R2 that is substantially constant in optical thickness, or else the optical thickness of optical repeating unit R2 may decrease monotonically along the thickness of multilayer stack M2. If the optical thickness of optical repeating unit R2 is substantially constant, the optical thickness thereof should be equal to the maximum optical thickness of optical repeating unit R1 along the thickness of multilayer stack M1. Preferably, the optical thickness of optical repeating unit R2 is substantially equal to the maximum optical thickness of optical repeating unit R1.

Figure 12C:
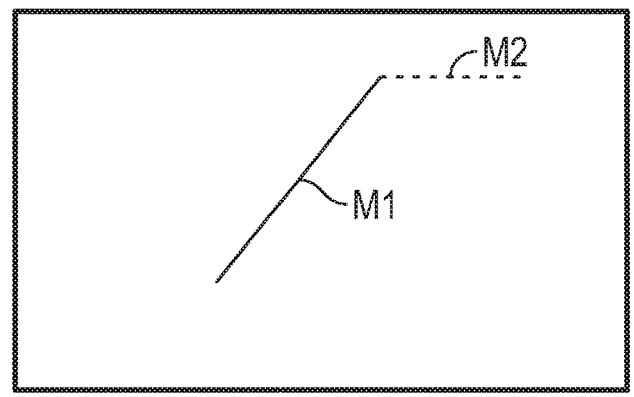

FIG. 12C depicts an exemplary plot of the optical thickness of optical repeating units R1 and R2 versus the optical repeating unit number in a reflective film body in connection with the present disclosure. In FIG. 12C, multilayer stack M1 includes optical repeating unit R1 of increasing optical thickness, and multilayer stack M2 comprises optical repeating units R2 of substantially constant optical thickness. A reflective film body designed in accordance with FIG. 12C will exhibit a sharpened bandedge at a red end, or a larger wavelength end, of a desired portion of the spectrum.

Figure 12D:
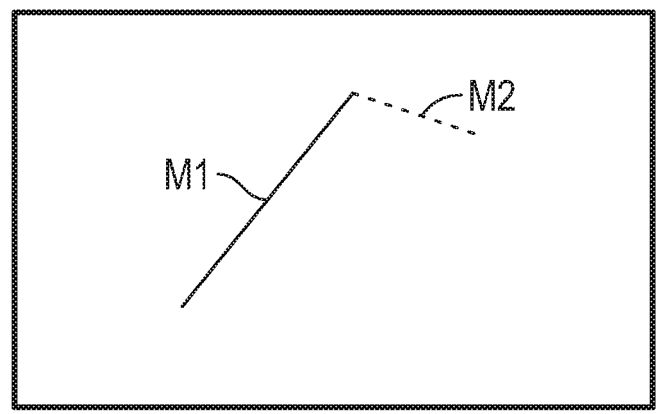

FIG. 12D depicts another embodiment of the present disclosure that also leads to sharpening of the reflection band on the red side, or larger wavelength side. As shown in FIG. 12D, multilayer stack M2 now comprises an optical repeating unit R2 that decreases monotonically in optical thickness along the thickness of multilayer stack M2. The maximum optical thickness of optical repeating unit R2 in this embodiment is such that it is substantially equal to the maximum optical thickness of optical repeating unit R1 along multilayer stack M1.

Figure 12E:
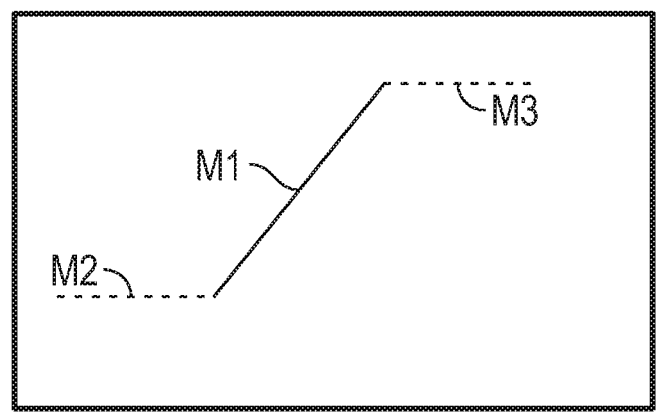

To obtain bandedge sharpening at both ends of the reflection band, three multilayer stacks M1, M2 and M3 can be combined as in the embodiment shown in FIG. 12E. There, multilayer stack M1 comprises an optical repeating unit R1 that monotonically increases along the thickness of multilayer stack M1. At the end of the stack, where R1 has the minimum optical thickness, multilayer stack M1 is combined with multilayer stack M2 that comprises optical repeating unit R2 having a constant optical thickness. The optical thickness of R2 is either substantially equal (as shown in FIG. 12E) or is less than the minimum optical thickness of optical repeating unit R1. As already described above for obtaining bandedge sharpening at the blue edge of the reflection band, optical repeating unit R2 can also decrease monotonically along the thickness of multilayer stack M2.

In some implementations, the optical filter 158 is birefringent, meaning that refractive indices for light traveling along at least two of three principal and perpendicular directions (x, y and z axes) of the optical filter 158, are not equal. Further, the refractive indices for light traveling along three principal and perpendicular directions (x, y and z axes) may not be equal in certain implementations.

In some implementations, the optical device 150 includes a polarizer. Such a polarizer can be a circular polarizer, a linear polarizer, a reflective polarizer or any other type of polarizer commonly known to one skilled in the art. The polarizer allows light of certain polarizations to pass while blocking others. In some implementations, the optical device 150 includes a retarder. The retarder functions to alter a polarization state of light passing therethrough. Through the polarization properties of the polarizer and polarization alteration properties of the retarder, along with the small size of pixels 178 relative to the written regions 198, 204 and areas 220, 224, 228, 232, optical data sensed by the optical sensor 154 can be refined to thereby increase a signal-to-noise ration of the optical device and/or to achieve a particular polarization to best suit the absorptive properties of the optical sensor 154.

Further, the optical device can include a plurality of polarizers. In some implementations, the light source can include a polarizer. In some implementations, the optical device can include a second polarizer. In some implementations, the light source includes a polarizer while the optical device 150 includes another polarizer. In some implementations, the polarizer included with the light source and/or the polarizer included with the optical device 150 are wavelength selective.

In some implementations, the polarizer included with the light source and/or the polarizer included with the optical device 150 is a linear polarizer. In some implementations, the polarizer included with the light source and/or the polarizer included with the optical device 150 is a circular polarizer. In some implementations, the polarizer included with the light source and the polarizer included with the optical device 150 are linear polarizers and each of the polarizers are arranged in parallel, or that the polarization axes of the polarizers are arranged in parallel or substantially in parallel. In some implementations, the polarizer included with the light source and the polarizer included with the optical device 150 are linear polarizers and each of the polarizers are arranged orthogonal to one another, or that the polarization axes of the polarizers are arranged orthogonal to one another or substantially orthogonal to one another.

In some implementations, the polarizer included with the light source and the polarizer included with the optical device 150 are circular polarizers and each of the polarizers are arranged in parallel, or that the polarization axes of the polarizers are arranged in parallel or substantially in parallel. In some implementations, the polarizer included with the light source and the polarizer included with the optical device 150 are circular polarizers and each of the polarizers are arranged orthogonal to one another, or that the polarization axes of the polarizers are arranged orthogonal to one another or substantially orthogonal to one another.

Item 1. An optical device comprising an optical sensor; a plurality of photosensitive pixels disposed on the optical sensor; a wavelength-selective optical filter in optical communication with the photosensitive pixels; and a plurality of spatially-variant written regions disposed in the optical filter, the written regions having a transmission spectrum and each of the written regions being larger than each of the pixels.

Item 2. The optical device of item 1, wherein the optical sensor is a flexible optical sensor.

Item 3. The optical device of item 1, wherein the wavelength-selective optical filter is flexible.

Item 4. The optical device of item 1, wherein the wavelength-selective optical filter includes a non-written region, the non-written region having a transmission spectrum different from that of the written regions.

Item 5. The optical device of item 1, wherein the optical sensor includes one or more photosensors.

Item 6. The optical device of item 1, wherein the optical sensor includes one or more organic photosensors.

Item 7. The optical device of item 1, further including an auxiliary written region disposed in the optical filter, the auxiliary written region being distinct from the written region, the auxiliary written region having an auxiliary transmission spectrum distinct from the transmission spectrum, and the auxiliary written region being larger than each of the pixels.

Item 8. The optical device of item 7, wherein a shape of the written regions is different from a shape of the auxiliary written region.

Item 9. The optical device of item 7, wherein a size of the written regions is different from a size of the auxiliary written region.

Item 10. The optical device of item 1, wherein the optical sensor includes at least one reference pixel.

Item 11. An optical device, comprising an optical sensor; a plurality of photosensitive pixels disposed on the optical sensor; a wavelength-selective optical filter in optical communication with the photosensitive pixels; a plurality of spatially-variant written regions disposed in the optical filter, the written regions having a transmission spectrum and each of the written regions being larger than each of the pixels; and an angle-selective filter in optical communication with the optical sensor and optical filter.

Item 12. The optical device of item 11, wherein a transmission angle of the angle-selective filter is centered around 0 degrees.

Item 13. The optical device of item 11, wherein a transmission angle of the angle-selective filter is centered around 30 degrees.

Item 14. The optical device of item 11, wherein a transmission angle of the angle-selective filter is centered around 60 degrees.

Item 15. The optical device of item 11, wherein the angle-selective filter includes louvers.

Item 16. The optical device of item 11, further including a second angle-selective filter separate from the original angle-selective filter, wherein arcs defining a range of possible angles about which the second angle-selective filter is centered and about which the original angle-selective filter is centered define perpendicular planes when the second angle-selective filter and original angle-selective filter are arranged in parallel.

Item 17. An optical device comprising an optical sensor; a plurality of photosensitive pixels disposed on the optical sensor; a wavelength-selective optical filter in optical communication with the photosensitive pixels; a first plurality of spatially-variant areas disposed in the optical filter; and a second plurality of spatially-variant areas disposed in the optical filter, the areas of the first plurality of spatially-variant areas having a transmission spectrum different from that of the areas of the second plurality of spatially-variant areas.

The present disclosure should not be considered limited to the particular examples and embodiments described above, as such embodiments are described in detail in order to facilitate explanation of various aspects of the disclosure. Rather, the present disclosure should be understood to cover all aspects of the disclosure, including various modifications, equivalent processes, and alternative devices falling within the scope of the disclosure as defined by the appended claims and their equivalents.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof

What is claimed is:

1. An optical device, comprising:
   an optical sensor;
   a plurality of photosensitive pixels disposed on the optical sensor; and
   a wavelength-selective optical filter in optical communication with the photosensitive pixels, the wavelength-selective optical filter comprising first and second filter sheets, each of the first and second filter sheets defining therein a plurality of spatially-variant written regions and at least one non-written region, the written and non-written regions of the first and second filter sheets partially overlapping one another to define first through fourth areas of the optical filter having respective different first through fourth transmission spectra, each of the first through fourth areas being larger than each of the pixels.

2. The optical device of claim 1, wherein the optical sensor is a flexible optical sensor.

3. The optical device of claim 1, wherein the wavelength-selective optical filter is flexible.

4. The optical device of claim 1, wherein the optical sensor includes one or more photosensors.

5. The optical device of claim 1, wherein the optical sensor includes one or more organic photosensors.

6. The optical device of claim 1, further including an auxiliary written region disposed in the optical filter, the auxiliary written region being distinct from each of the written regions, the auxiliary written region having an auxiliary transmission spectrum distinct from each of the first through fourth transmission spectra, and the auxiliary written region being larger than each of the pixels.

7. The optical device of claim 6, wherein for each of the written regions, a shape of the written region is different from a shape of the auxiliary written region.

8. The optical device of claim 6, wherein for each of the written regions, a size of the written region is different from a size of the auxiliary written region.

9. The optical device of claim 1, wherein the optical sensor includes at least one reference pixel.

10. The optical device of claim 1, further comprising:
    an angle-selective filter in optical communication with the optical sensor and the wavelength-selective optical filter.

11. The optical device of claim 10, wherein a transmission angle of the angle-selective filter is centered around 0 degrees.

12. The optical device of claim 10, wherein a transmission angle of the angle-selective filter is centered around 30 degrees.

13. The optical device of claim 10, wherein a transmission angle of the angle-selective filter is centered around 60 degrees.

14. The optical device of claim 10, wherein the angle-selective filter includes louvers.

15. The optical device of claim 10, further including a second angle- selective filter separate from the original angle-selective filter, wherein arcs defining a range of possible angles about which the second angle-selective filter is centered and about which the original angle-selective filter is centered define perpendicular planes when the second angle-selective filter and original angle-selective filter are arranged in parallel.

\* \* \* \* \*